United States Patent [19]
Matano

[11] Patent Number: 5,724,291
[45] Date of Patent: Mar. 3, 1998

[54] SEMICONDUCTOR MEMORY DEVICE WITH REDUCED CHIP AREA

[75] Inventor: Tatsuya Matano, Tokyo, Japan

[73] Assignee: NEC Corporation, Tokyo, Japan

[21] Appl. No.: 754,410

[22] Filed: Nov. 21, 1996

[30] Foreign Application Priority Data

Nov. 30, 1995 [JP] Japan ................................ 7-338190

[51] Int. Cl.[6] ................................................. G11C 13/00
[52] U.S. Cl. ............................... 365/207; 365/230.06
[58] Field of Search ........................... 365/189.01, 230.01, 365/189.05, 207, 230.06

[56] References Cited

U.S. PATENT DOCUMENTS 4,472,792  9/1984  Shimohigashi et al. ............ 365/189.01

OTHER PUBLICATIONS

Komatsuzaki et al., "Circuit Techniques For a Wide Word I/O Path 64 Meg DRAM", Symposium on VLSI Circuits Digest of Technical Papers, pp. 133–134, 1991.

*Primary Examiner*—Terrell W. Fears
*Attorney, Agent, or Firm*—Foley & Lardner

[57] ABSTRACT

A semiconductor memory has memory cells arranged in a matrix to form a memory cell block. A word line is connected to each row of memory cells. The cell block has a pair of data lines, a row decoder circuit for activating one of the word lines and the pair of data lines, and a column decoder circuit for generating read and write select signals to selectively activate a desired column of memory cells and set that column to either a read or write mode. Each memory cell column has a pair of digit lines, a sense amplifier for amplifying differential data signals on the digit lines and read and write data transfer circuits for transferring differential read and write data signals to the digit lines in the read and write modes. The read data transfer circuit includes a pair of first MOS transistors connected to the data lines and activated with the read select signal, and a pair of second MOS transistors connected to the first MOS transistors in series. The gates of the second MOS transistors are connected to the digit lines. The second MOS transistors are operable to drive the data lines via the first MOS transistors by the differential read data signals in the read mode. The write data transfer circuit includes a pair of third MOS transistors provided between the data lines and the digit lines and activated with the write select signal.

21 Claims, 10 Drawing Sheets

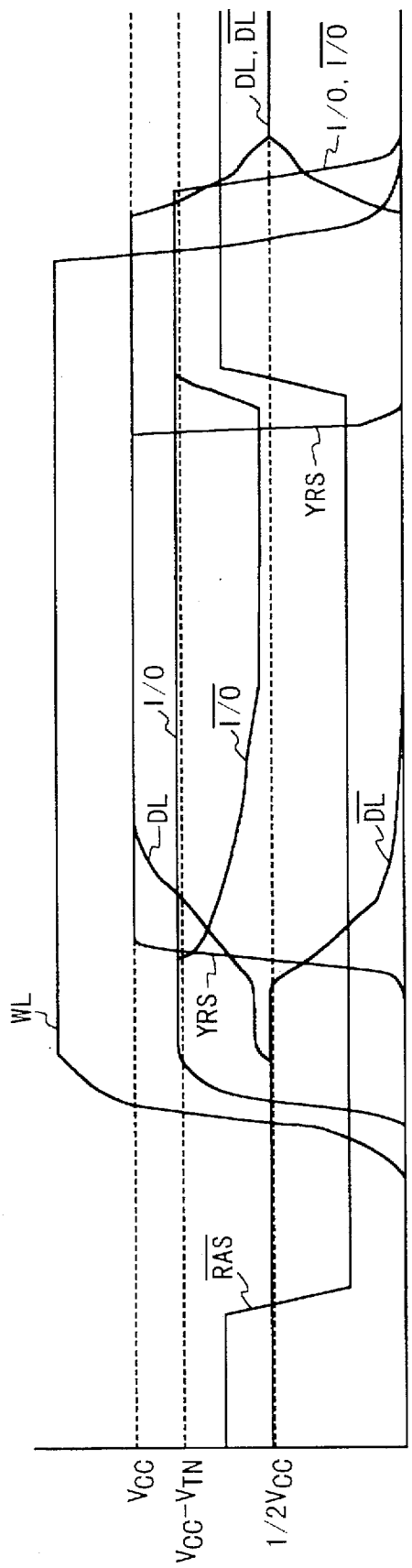

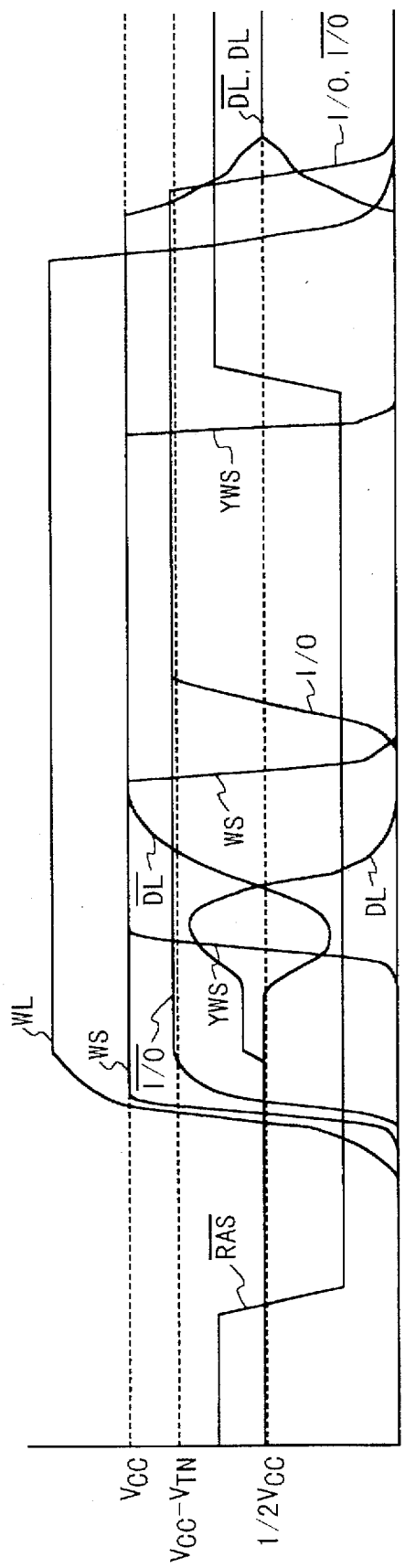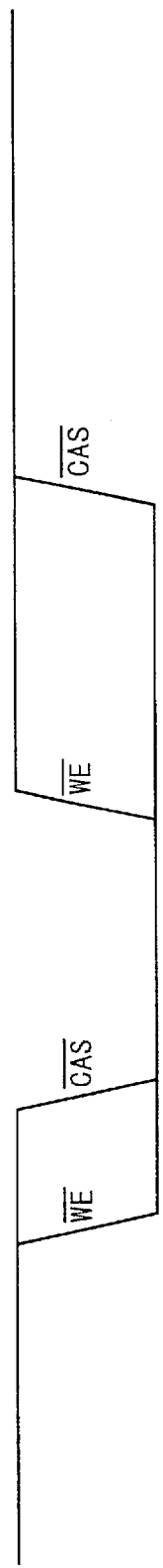

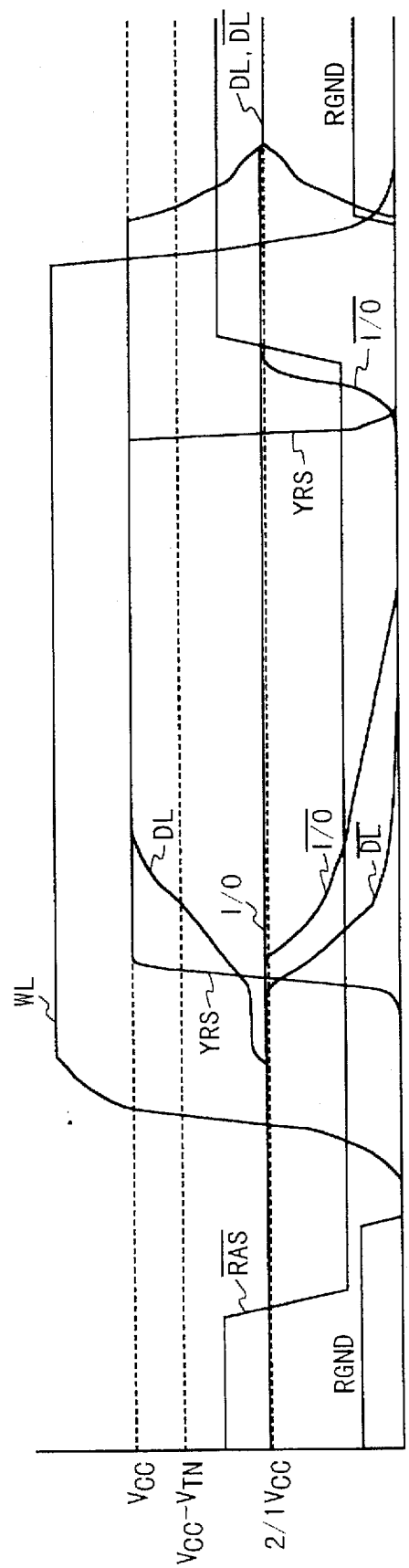

SEMICONDUCTOR MEMORY DEVICE WITH REDUCED CHIP AREA

BACKGROUND OF THE INVENTION

1. Field of the Invention

The present invention relates to a semiconductor memory device, and more particularly to a dynamic random access memory device.

2. Description of Related

Of semiconductor memory devices, a dynamic memory device is one that can be randomly accessed, i.e., a random access memory device (DRAM). The DRAM can store data, in a capacitor of a memory cell in a form of signal electric charge. The data stored in the capacitor of the memory cell is amplified by a sense amplifier circuit and is output onto a pair of data lines. Means of transferring the data to the pair of data lines is well known. A data transfer circuit of a direct sense system applies the differential signals of the data amplified by the sense amplifier circuit to the gates of transistors and the data transfer is performed using the difference in drive capability between the transistors.

FIG. 1 is a block diagram illustrating the structure of a pat of a first conventional semiconductor memory device. FIG. 2 is a diagram illustrating the signal wave forms of various signals of the first conventional semiconductor memory device. Referring to FIG. 1, a part of semiconductor memory device is composed of a pair of digit lines DL and DL* ("*" indicates an inverted signal or a Low active signal), a memory cell MC2, a sense amplifier SA, a word line WL, N-channel MOS transistors Qn9 to Qn16, a write control line WS, a pair of read data lines RO and RO*, a pair of write data lines WI and WI*, and a column decoder YDEC. A column select signal YSW is output from the column decoder YDEC.

Next, referring to FIG. 2, the operation of the conventional semiconductor memory device will be described. In a data read operation, a row address strobe (RAS) signal, which an external signal and is not shown in FIG. 1, is changed from a High level to a Low level such that an external address is taken in the memory device. As a result, one of a plurality of word lines WL is selected based on the external address and the potential of the word line WL is changed to the High level. Also, a pair of read data lines is selected in units of memory cell blocks. Not selected pairs of data lines are in the Low or ground (GND) level. The potential of the selected pair of data lines are raised up to a potential of $(V_{CC}-V_{TN})$, where $V_{CC}$ is the power supply voltage and $V_{TN}$ is the threshold voltage of an N-channel MOS transistor.

The digit lines DL and DL* have been precharged to the potential of $(½)V_{CC}$. A memory cell MC2, which is connected to the selected word line WL, is selected and the data stored in the selected memory cell is output onto one of the pair of digit lines DL and DL*, e.g., the line DL in this case. Then, the data on the pair of digit lines DL and DL* is amplified by the sense amplifier SA. The data amplified by the sense amplifier SA is applied to the gates of the N-channel MOS transistors Qn9 and Qn10. In this example, the high potential is applied to the gate of the MOS transistor Qn9 and the low potential is applied to the gate of the MOS transistor Qn10, as shown in FIG. 2.

Then, the column select signal YSW is generated by the column decoder circuit YDEC based on the external address and the potential of the column select signal YSW is changed from the Low level to the High level. At this time, the write control signal WS is held in the Low level. Accordingly, the N-channel MOS transistors Qn11 and Qn12 are turned on to be set in the conductive state. As a result, the pair of digit lines DL and DL* are connected to the pair of read data lines RO and RO* such that the amplified data on the pair of digit lines is transferred to the pair of read data lines RO and RO*. In this case, using the difference in drive capability between the N-channel MOS transistors Qn9 and Qn10, the Low level potential on one of the pair of digit lines DL and DL* is transferred to one of the pair of read data lines RO and RO* in the form of High level potential in an inverted manner. In this example, the read data line RO* connected to the MOS transistor Qn9 is pulled down into the Low potential and the data line RO is maintained in the High level.

In a data write operation, a data is written onto the pair of write data lines WI and WI*, which have been precharged to the power supply voltage $V_{CC}$. Accordingly, one of the write data lines WI and WI* is set to the High level and the other is set to the Low level. The sense amplifier SA is in the active state. At this time, the potential of the write control signal WS is changed from the Low level to the High level so that the N-channel MOS transistors Qn13 and Qn14 are turned on. Also, the potential of the column select signal YSW is raised to the High level so that the N-channel MOS transistors Qn15 and Qn16 are turned on. As a result, the pair of write data lines WI and WI* are connected to the pair of digit lines DL and DL* such that the data written onto the pair of write data lines WI and WI* is transferred onto the pair of digit lines DL and DL* and then written into the memory cell MC2 by the sense amplifier because the word line WL has been selected.

Next, FIG. 3 is a circuit diagram illustrating the structure of a second conventional semiconductor memory device. In FIG. 3, two circuit portions each of which is the same as shown in FIG. 1 are provided. Also, each circuit portion is provided with one pair of read data lines RO and RO*, or RO' and RO'* and one pair of write data lines WI and WI*, or WI' and WI'*. Further, one column select line YSW from the column decoder YDEC is used in common with the two circuit portions. The operation of each circuit portion is the same as that of the circuit portion shown in FIG. 1. Therefore, the description of the operation will be omitted.

In the first and second conventional semiconductor memory devices, the data read out from the memory cells MC2 and MC2' and amplified by the sense amplifiers SA and SA' are transferred to the pair of read data lines RO and RO* and RO' and RO'* via the two N-channel MOS transistors Qn9 and Qn11, and Qn10 and Qn12; and Qn9' and Qn11', and Qn10' and Qn12', which are connected in series, in the data read operation, respectively. On the other hand, in the data write operation, data written on the pair of write data lines WI and WI* is written in the memory cell MC2 via the N-channel MOS transistors Qn13 and Qn15, and Qn14 and Qn16, which are connected in series, and data written on the pair of write data lines WI' and WI'* is written in the memory cell MC2' via the N-channel MOS transistors Qn13' and Qn15', and Qn14' and Qn16'. As described above, in the second conventional semiconductor memory, the pair of data read lines RO and RO* and the pair of data write lines WI and WI* need to be provided for each circuit portion. As a result, there is a problem in that the number of data lines is necessary to be increased.

Next, FIG. 4 is a circuit diagram illustrating the structure of 64-Mbit DRAM as a third conventional semiconductor memory device (See "Circuits Techniques For a Wide Word I/O Path 64 Meg DRAM", (SYMPOSIUM ON VLSI CIR- CUITS DIGEST OF TECHNICAL PAPERS, pp. 133–134, 1991)). Referring to FIG. 4, the semiconductor memory device includes a plurality of sense amplifiers SA and SA' and data amplified by the sense amplifier SA is transferred to a pair of common data lines I/O and I/O*. The pair of common data lines I/O and I/O* are used in both the data read operation and the data write operation.

Referring to FIG. 4, the third conventional semiconductor memory device is composed of two pairs of digit lines DL and DL*, and DL' and DL'*, memory cells MC3 and MC4, sense amplifiers SA and SA', a word line WL, N-channel MOS transistors Qn17 to Qn27, a write control line WS, a sense amplifier select line S/A SELECTS, a pair of sub-data lines SUB I/O and SUB I/O*, a pair of common data lines I/O and I/O*, a control line SEC SELECT, and a column decoder YDEC. A column read select signal YREAD and a column write select signal YWRITE are output from the column decoder YDEC.

Next, the operation of the third conventional semiconductor memory device will be described in brief. In a data read operation, the sense amplifier SA is selected in accordance with a sense amplifier select signal S/A SELECTS and data stored in the memory cell MC3 is amplified by the sense amplifier SA and applied to the gates of the N-channel MOS transistors Qn18 and Qn19 via the pair of sub-data lines SUB I/O and SUB I/O*. The signals on the pair of sub-data lines are complementary signals and the potential of one of the gates of the transistors Qn18 and Qn19 is in the High level and the potential of the other is in the Low level. Also, the N-channel MOS transistors Qn22 and Qn23 are turned on in accordance with the control signal SEC SELECT. Therefore, the data transfer circuit of the transistors Qn17, Qn18 and Qn19 is connected to the pair of common data lines I/O and I/O*.

Then, the read select signal YREAD from the Y decoder YDEC is activated, i.e., changed from the Low level to the High level so that the N-channel MOS transistor Qn17 is turned on. As a result, the data transfer circuit is activated. At that time, the write select signal YWRITE is in the Low level. In this case, one of the common data lines I/O and I/O*, which is connected to one of the MOS transistors Q18 and Qn19 to whose gate the High level potential is applied, is pulled down to the Low level in potential and the other data line is left in the High level.

In the data write operation, the pair of common data lines I/O and I/O* onto which a data is externally written is connected to the data transfer circuit through the N-channel MOS transistors Qn22 and Qn23 which are turned on in response to the control signal SEC SELECT, and the N-channel MOS transistors Qn20 and Qn21, which will be turned on in response to the column write select signal YWRITE. At this time, the sense amplifier is in the active state after amplifying data of the memory cell MC3 or MC4, and the sense amplifier, which is selected in accordance with the sense amplifier select signal S/A SELECTS is connected to the data transfer circuit through the pair of sub data lines SUB I/O and SUB I/O*. Then, the potential of the write select line YWRITE, which has been selected in accordance with the external address, is changed from the Low level to the High level so that the N-channel MOS transistors Qn20 and Qn21 are turned on. As a result, the selected sense amplifier is connected to the pair of common data lines I/O and I/O*, the data on the pair of common data lines is written into the memory cell via the selected sense amplifier.

In the third conventional semiconductor memory device, because the data transfer circuit is shared by the plurality of sense amplifiers, the size of each sense amplifier can be made small. However, there is a problem in that data, which has activated in a previous access cycle, is left on the pair of sub data lines SUB I/O and SUB I/O* and collides with another data read out in the next access cycle. Further, in the data read operation, data is transferred to the pair of common data lines I/O and I/O* via three series-connected transistors, which are composed of transistors Qn17, Qn18 and Qn23 and Qn17, Qn19 and Qn22. Therefore, there is another problem in that because a series resistance of the three transistors is large and the MOS transistor Qn17 is finally turned on, the data transfer time is long.

As described above, in the case where different pairs of data lines are provided for the read and write operations as in the first and second conventional semiconductor memory devices, there is the problem in that although the access speed can be increased, the number of lines increases. On the other hand, in the case where one pair of data lines is used in common to the read and write operations as in the third conventional semiconductor memory device, there is the problem in that because data is transferred to the pair of data lines via the three MOS transistors connected in series, the access speed is decreased or slow.

SUMMARY OF THE INVENTION

Therefore, the present invention is made in the light of above circumstances and has, as an object, a method and semiconductor memory device for increasing access speed while a pair of data lines is used in common to a read operation and write operation.

In order to achieve an aspect of the present invention, a semiconductor memory device includes a memory cell block composed of a plurality of memory cells arranged in a matrix manner, a pair of data lines provided for the memory cell block, a plurality of word lines each of which is connected to a row of memory cells of the memory cell block, a row decoder circuit provided for the memory cell block, and selectively activated in accordance with an address to activate one of the plurality of word lines and the pair of data lines, a pair of digit lines provided for each column of memory cells of the memory cell block, a sense amplifier provided for each column of memory cells, for amplifying differential data signals on the digit lines, a column decoder circuit provided for the memory cell block, for selectively activating one of a plurality of columns of memory cells in accordance with the address and selectively setting the activated column of memory cells to one of a read mode and a write mode in a read/write control signal, a read data transfer circuit provided for each column of memory cells, for respectively transferring differential read data signals to the digit lines in the read mode when the column of memory cells is activated, the differential read data signals corresponding to data read out from one memory cell of the activated column of memory cells connected to the activated word line and amplified by the sense amplifier, and a write data transfer circuit provided for each column of memory cells, for respectively transferring differential write data signals on the data lines to the digit lines in the write mode when the column of memory cells is activated, a data corresponding to the differential write data signals being written in one memory cell of the activated column of memory cells connected to the activated word line.

The column decoder circuit generates one of a read select signal and a write select signal in accordance with the address and the read/write control signal such that the read select signal is supplied to the read data transfer circuit for the activated column of memory cells and the write select signal is supplied to the write data transfer circuit for the activated column of memory cells. The read data transfer circuit includes a pair of first MOS transistors respectively connected to the data lines and turned on in response to the read select signal, and a pair of second MOS transistors respectively connected to the first MOS transistors in series. The gates of the second MOS transistors are respectively connected to the digit lines, wherein the second MOS transistors are operable to drive the data lines via the first MOS transistors in response to the differential read data signals in the read mode. In this case, one electrode of each of the second MOS transistors may be fixedly connected to ground potential. Alternatively, the row decoder circuit includes a potential control circuit for controlling a potential of a read drive line connected to one electrode of each of the second MOS transistors for each column of memory cells, and the potential control circuit may dynamically drive the read drive line such that the potential of the read drive line is set to a ground potential in the read mode when the memory cell block is activated and is set to a predetermined potential otherwise.

The write data transfer circuit includes a pair of third MOS transistors respectively provided between the data lines and the digit lines and operable to be turned on in response to the write select signal. In this case, the row decoder circuit may include a data line precharging circuit for precharging the data lines to a potential equal to a precharge potential of the digit lines. Alternatively, in a case where the write data transfer circuit further includes a pair of fourth MOS transistors respectively provided between the data lines and the digit lines and turned on in response to a write control signal, the row decoder circuit may include a data line precharging circuit for precharging the data lines to a potential corresponding to a higher side of the differential read data signals in the read mode when the memory cell block is activated. The data line precharging circuit sets potential of the data lines to a ground potential in a mode other than the read mode or when the memory cell block is not activated.

In order to achieve another aspect of the present invention, a semiconductor memory device includes a memory cell block composed of a plurality of memory cells arranged in a matrix manner, two pairs of data lines provided for the memory cell block and respectively corresponding to every two columns of memory cells, a plurality of word lines each of which is connected to a row of memory cells of the memory cell block, a row decoder circuit provided for the memory cell block, and selectively activated in accordance with an address to activate one of the plurality of word lines and the two pair of data lines, a pair of digit lines provided for each column of memory cells of the memory cell block, a sense amplifier provided for each column of memory cells, for amplifying differential data signals on the digit lines, a column decoder circuit provided for the memory cell block, for selectively activating two of a plurality of columns of memory cells in accordance with the address and selectively setting the two activated columns of memory cells to one of a read mode and a write mode in a read/write control signal, a read data transfer circuit provided for each column of memory cells, for respectively transferring differential read data signals on the digit lines to a corresponding one of the two pairs of digit lines in the read mode when the column of memory cells is activated by the column decoder circuit, the differential read data signals corresponding to a data read out from one memory cell of the activated column of memory cells connected to the activated word line and amplified by the sense amplifiers, and a write data transfer circuit provided for each column of memory cells, for respectively transferring differential write data signals on the data lines to the corresponding one of the two pairs of digit lines in the write mode when the column of memory cells is activated by the column decoder circuit, data corresponding to the differential write data signals being written in one memory cell of the activated columns of memory cells connected to the activated word line. As described above, the read select signal and write select signal are commonly used for two columns of memory cells.

In order to achieve still another aspect of the present invention, a semiconductor memory device includes a pair of data lines on which information for a memory cell is transferred, a sense amplifier for amplifying the information, a pair of first transistors receiving the information amplified by the sense amplifier at control terminals, a pair of second transistors provided between signal terminals of the pair of first transistors and the pair of data lines, for outputting the amplified information to the pair of data lines in response to a data read column select signal supplied to control terminals of the pair of second transistors, and a pair of third transistors provided between the pair of data lines and the sense amplifier, for supplying the information on the pair of data lines to the sense amplifier in response to a data write column select signal supplied to control terminals of the pair of third transistors.

BRIEF DESCRIPTION OF THE DRAWINGS

FIG. 8 is a diagram illustrating the wave forms of various signals in the read operation of the semiconductor memory device according to the first embodiment of the present invention;

FIGS. 9A to 9C are diagrams illustrating the wave forms of various signals in the write operation of the semiconductor memory device according to the first embodiment of the present invention;

FIG. 12 is a diagram illustrating the wave forms of various signals in the read operation of the semiconductor memory device according to the third embodiment of the present invention.

DESCRIPTION OF THE PREFERRED EMBODIMENTS

The semiconductor memory device of the present invention will be described below in detail with reference to the accompanying drawings.

Figure 1:
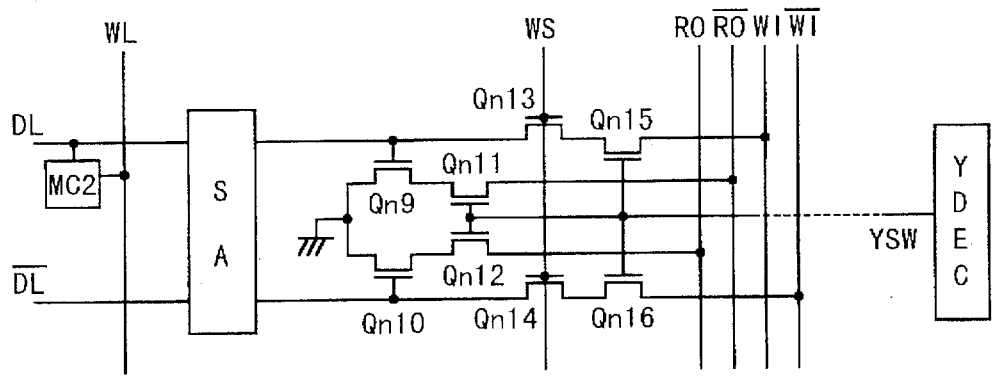
FIG. 1 is a circuit diagram showing the structure of a part of a first conventional semiconductor memory device.
Figure 3:
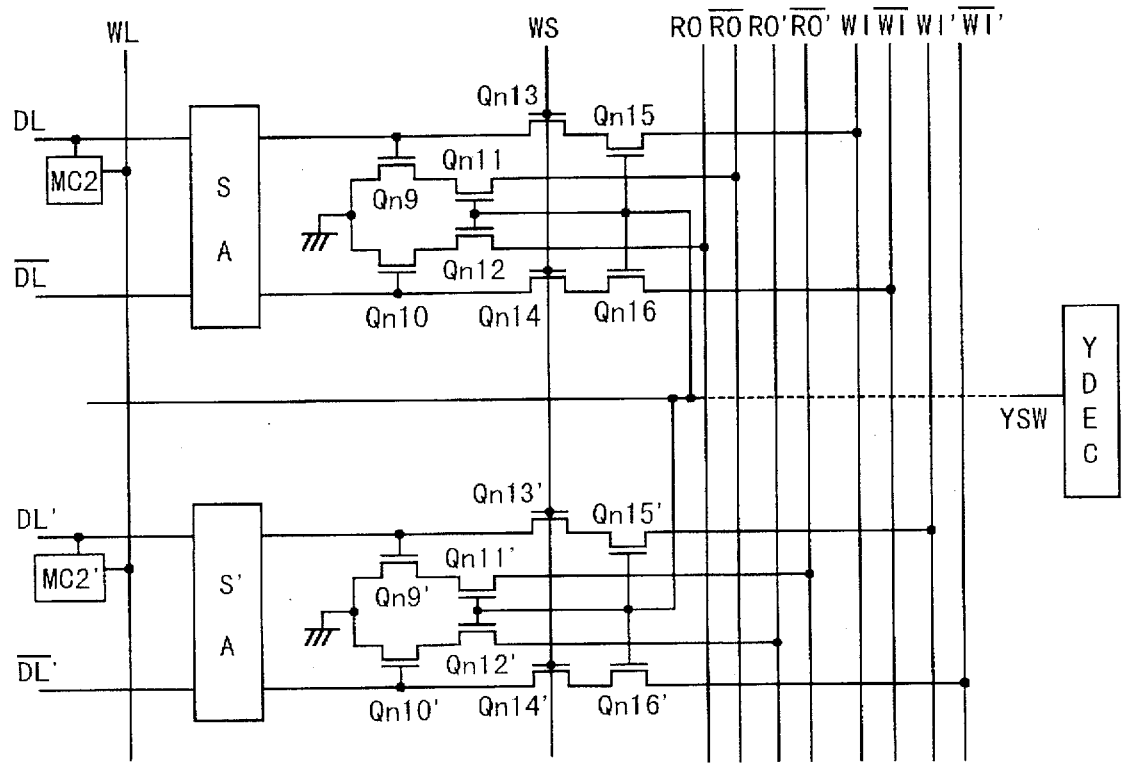
FIG. 3 is a circuit diagram showing the structure of a part of a second conventional semiconductor memory device.
Figure 2:
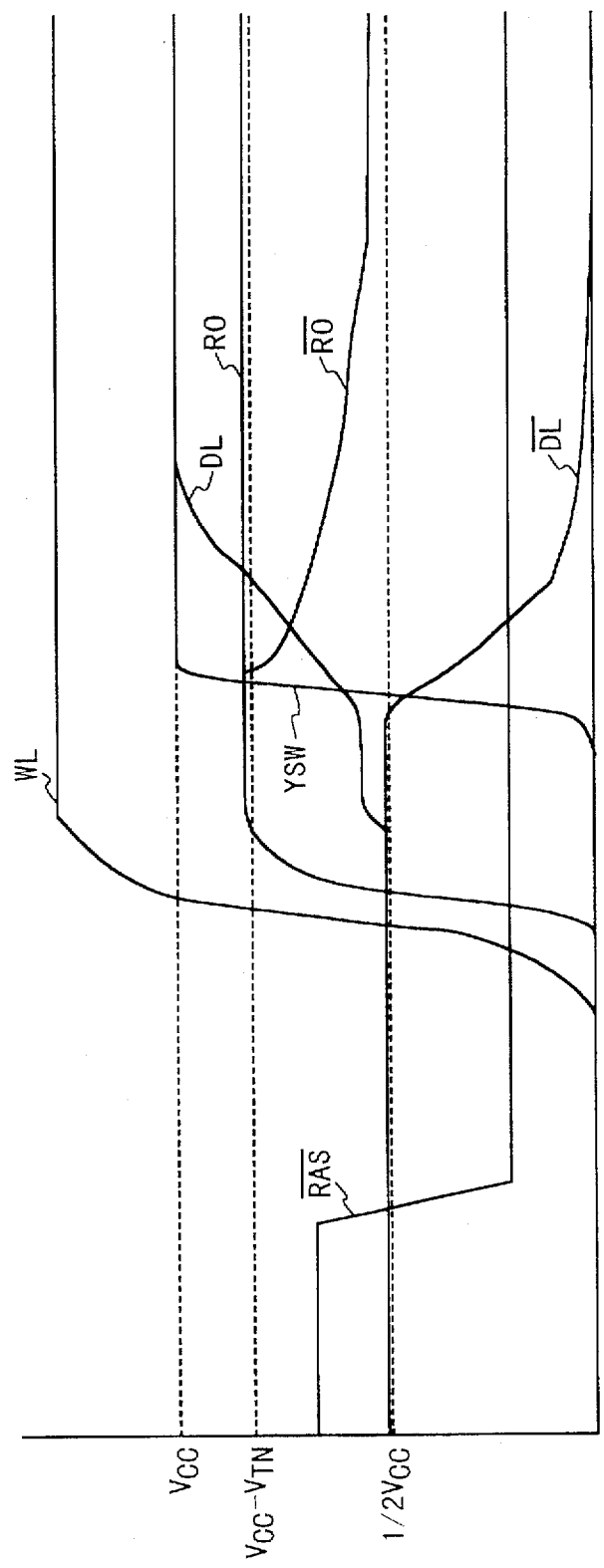
FIG. 2 is a diagram illustrating the wave forms of various signals in the read operation of the first conventional semiconductor memory device.
Figure 4:
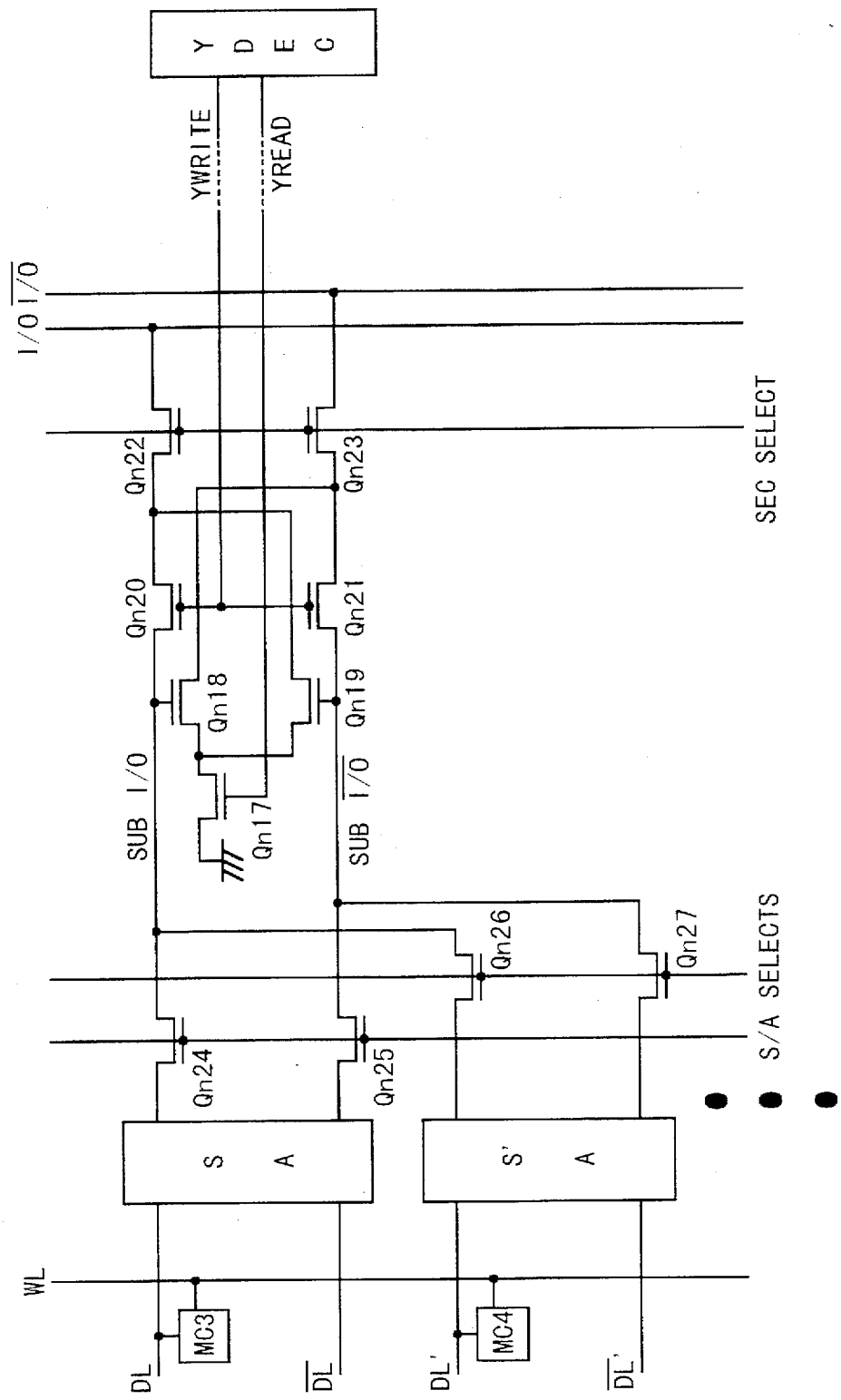
FIG. 4 is a circuit diagram showing the structure of a part of a third conventional semiconductor memory device.
Figure 5:
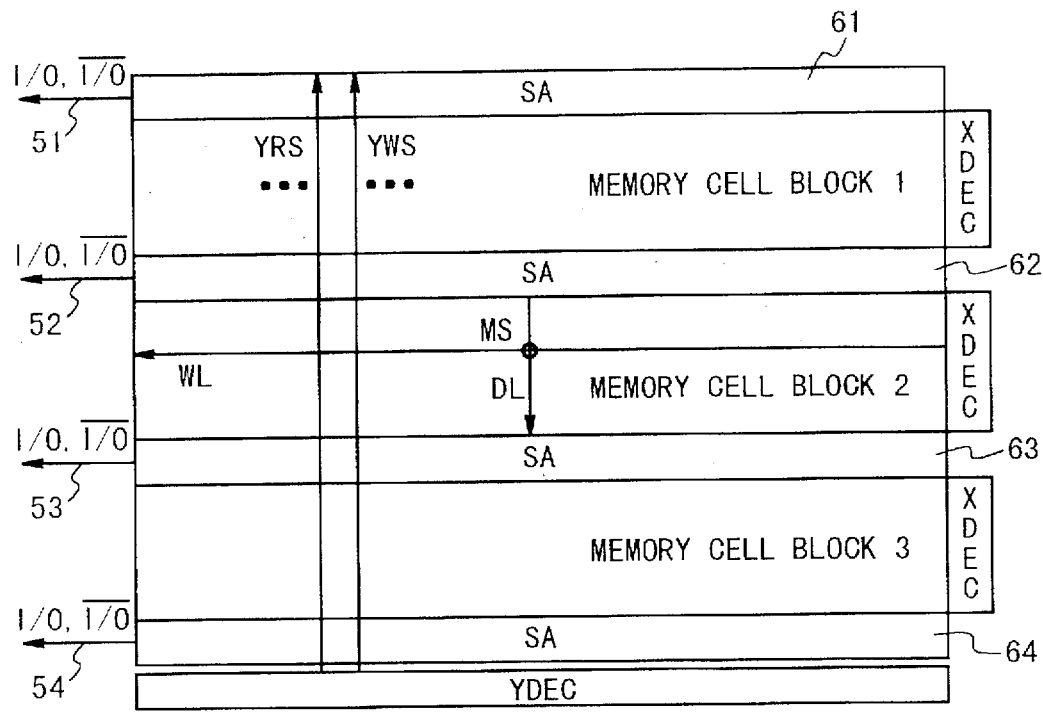
FIG. 5 is a block diagram illustrating the structure of a semiconductor memory device of the present invention.

FIG. 5 is a block diagram schematically illustrating the structure of the semiconductor memory device of the present invention. Referring to FIG. 5, a memory cell array is composed of a plurality of memory cell blocks. A column decoder circuit YDEC is provided in common for the plurality of memory cell blocks and row decoder circuits XDEC are respectively provided for the plurality of memory cell blocks. A plurality of sense amplifier circuits 61 to 64 are provided to sandwich each memory cell block and each sense amplifier circuit is connected to one pair of data lines I/O and I/O*. When an external address is supplied, one of the plurality of row decoder circuits is activated so that one of the plurality of memory cell blocks is selected and one of a plurality of word lines in the selected memory cell block is activated. The other word lines and all the word lines in the non-selected memory cell blocks are not activated. On the other hand, when the external address is supplied, the column decoder circuit YDEC generates a column read select signal YRS or a column write select signal YWS and these signals YRS and YWS are supplied in common to corresponding columns of memory cells over the plurality of memory cell blocks. In this semiconductor memory device, when it is accessed, the sense amplifier circuits provided on the both sides of the selected memory cell block are activated and the pairs of data lines connected to these sense amplifiers are precharged to a predetermined potential.

Figure 6:
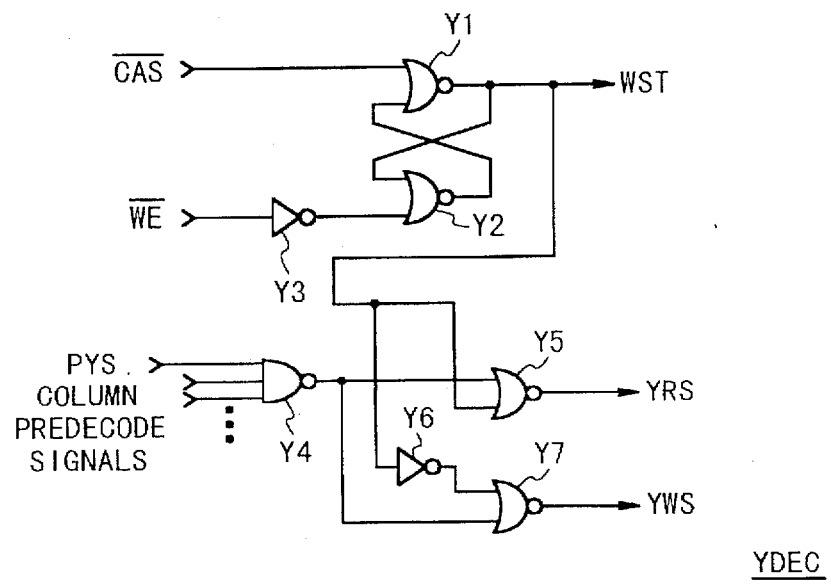
FIG. 6 is a circuit diagram illustrating the structure of a column decoder circuit YDEC of the semiconductor memory device shown in FIG. 5.

FIG. 6 is a circuit diagram illustrating the column decoder circuit YDEC. Referring to FIG. 6, a column address strobe signal CAS* and a write enable signal WE* are supplied. Any signal synchronous with the signal CAS* and any signal synchronous with the signal WE* may be used in stead. The signal WE* is inverted by an inverter Y3 and supplied to a cross coupled circuit composed of NOR gates Y1 and Y2 as well as the signal CAS*. A signal WST as an output of the cross coupled circuit is supplied directly to a NOR gate Y5 and via an inverter Y6 to a NOR gate Y7. A signal PYS synchronous with the signal CAS* and column predecode signals are supplied to a NAND gate Y4 and the output of the NAND gate Y4 is supplied to the NOR gates Y5 and Y7. The output of the NOR gate Y5 is the column read select signal YRS and the output of the NOR gate Y7 is the column write select signal YWS.

Figure 7:
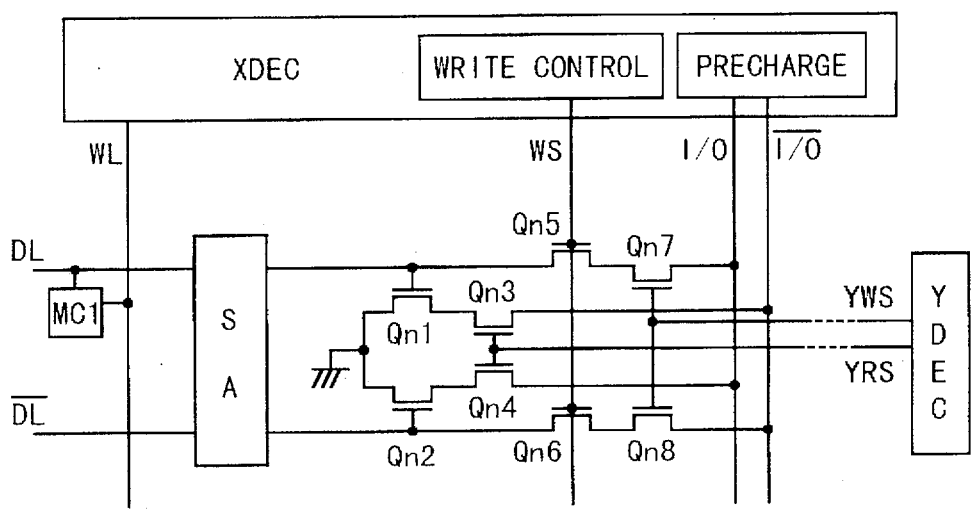
FIG. 7 is a block diagram illustrating the structure of a part of a semiconductor memory device according to a first embodiment of the present invention.

FIG. 7 is a circuit diagram illustrating the structure of a part of the semiconductor memory device according to the first embodiment of the present invention. Referring to FIG. 7, the semiconductor memory device of the first embodiment is composed of a pair of digit lines DL and DL*, a word line WL, a memory cell MC1 connected between one of the digit lines DL and DL* and the word line WL, a sense amplifier SA connected to the digit lines DL and DL*, a pair of common data lines I/O and I/O*, and a data transfer circuit including N-channel MOS transistors Qn1 and Qn2, N-channel MOS transistors Qn3 and Qn4 respectively connected between the transistors Qn1 and the data line I/O* and between the transistor Qn2 and the data line I/O, and N-channel MOS transistors Qn5 and Qn7, and Qn6 and Qn8 respectively provided between the digit line DL and the data line I/O and between the digit line DL* and the data line I/O*. Thus, one sense amplifier SA is provided for one data transfer circuit. One of the source and drain as signal terminals of each MOS transistor Qn1 or Qn2 is connected to the ground potential. The other terminals of the MOS transistors Qn1 and Qn2 are connected to the MOS transistor Qn3 and Qn4, respectively. The gates of the MOS transistors Qn1 and Qn2 as control terminals are connected to the digit lines DL and DL*, respectively. The semiconductor memory device further includes a row decoder XDEC and column decoder YDEC. The row decoder XDEC selectively activates a corresponding memory cell block and activating one of a plurality of word lines of the activated memory cell block in accordance with an external address. The row decoder XDEC includes a precharge circuit for precharging a pair of data lines corresponding to the activated memory cell block to a potential of $(V_{CC}-V_{TN})$ and a write control circuit for generating a write control signal WS corresponding to the signal WE*. The column decoder YDEC generates one of a column read select signal YRS and a column write select signal YWS in accordance with the external address and a write control signal, e.g., the signal WE* in this embodiment. The read select signal YRS is supplied to the gates of the MOS transistors Qn3 and Qn4 and the write select signal YWS is supplied to the gates of the MOS transistors Qn7 and Qn8. The gates of the MOS transistors Qn5 and Qn6 are supplied with the write control signal WS.

Next, the operation of the semiconductor memory device according to the first embodiment of the present invention will be described below. FIG. 8 is a timing chart diagram illustrating the wave forms of various signals in the read operation of the semiconductor memory device of the first embodiment. Referring to FIG. 8, in the data read operation, an external input signal RAS (not shown in FIG. 7) is changed from a High level to a Low level, so that the external address received and decoded by the row decoder XDEC. As a result, one of the plurality of word lines WL is selected in accordance with the decoding result of the row decoder, so that the potential of the selected word line WL drives to the High level potential. Also, one memory block is selected so that the pair of common data lines I/O and I/O* which have set to the ground level potential, are raised or precharged to the potential of $(V_{CC}-V_{TN})$, where $V_{CC}$ is a power supply voltage and V is a threshold voltage of the N-channel MOS transistor. In this manner, because the potential levels of common data lines I/O and I/O* are the ground potential level in a normal or non-selected state, even if the column read select signal YRS is input to the pair of MOS transistors Qn3 and Qn4, no current flows through the data transfer circuit from the pair of common data lines I/O and I/O* in the non-selected memory cell blocks.

Next, data stored in the memory cell MC1 connected to the selected word line WL is output onto the pair of digit lines DL and DL*, which have been precharged to the potential of $(½)V_{CC}$. Then, the data on the pair of digit lines DL and DL* is amplified by the sense amplifier SA. The differential signals of data amplified by the sense amplifier SA are applied to the gates of the N-channel MOS transistors Qn1 and Qn2 of the data transfer circuit. In FIG. 8, the High level signal is applied to the gate of the transistor Qn1 and the Low level signal is applied to the gate of the transistor Qn2. Then, the column read select signal YRS, which is generated by the column decoder YDEC based on the external address and the write enable signal WE*, is changed from the Low level to the High level (the column write select signal YWS is remained in the Low level). As a result, the N-channel MOS transistors Qn3 and Qn4 are turned on such that the pair of digit lines DL and DL* are connected to the pair of common data lines I/O and I/O*, and the data read out from the memory cell MC1 is transferred to the pair of common data lines I/O and I/O*.

The data transfer is performed using the difference in drive capability between the MOS transistors Qn1 and Qn2. The data line connected to one of the transistors to whose gate the High level potential is applied is set to the Low level. On the other hand, the data line connected to the other transistor to whose gate the Low level potential is applied is set to the High level. In FIG. 8, because the potentials of digit lines DL and DL* are the High and Low levels, respectively, the data lines I/O* connected to the transistor Qn1 is driven to the Low level and the data I/O is driven to the High level.

Then, the column read select signal YRS goes to the Low level, the pair of data lines I/O and I/O* are raised to the High level. When the signal RAS* goes back to the High level, the word line WL is dropped to the ground potential. Then, for the next access cycle, the pair of data lines are discharged to the ground potential and the pair digit lines are precharged to $(\frac{1}{2})V_{CC}$.

In the data write operation, referring to FIGS. 9A to 9C, the row address strobe signal RAS* is first changed from the High level to the Low level and then one word line WL is selected as shown in FIG. 9A. Subsequently, when a write enable signal WE* is changed to the Low level so that the write control signal WS is driven to the High level by the write control circuit of the row decoder. As a result, the pair of N-channel MOS transistors Qn5 and Qn6 are turned on. Differential write data signals as write data are written onto the pair of data lines I/O and I/O*, which have been set in the GND level. At this time, one of the data lines is in the $V_{CC}$ power supply level and the other is in the GND level. Then, a column strobe signal CAS* is activated to go to the Low level as shown in FIG. 9B and the signal PYS is generated in synchronous with the signal CAS*, as shown in FIG. 9C. Accordingly, the column write select signal YWS is generated as described above, so that the pair of MOS transistors Qn7 and Qn8 are turned on. As a result, the pair of data lines I/O and I/O* are connected to the pair of digit lines DL and DL*. The sense amplifier SA in the active state amplifies the differential write data signals, which are, in turn, written in the memory cell MC1 through the pair of digit lines D1 and DL*. In this case, even if the column write select signal YWS is supplied to the non-selected memory cell blocks, no current flows from the pair of data lines I/O and I/O* because the write control signal WS is active only in the selected memory cell block but is not active in the non-selected memory cell blocks.

After the write to the memory cell MC1, the write enable signal WE* goes to the High level and then the control signal WS is also made inactive. Then, the pair of data lines I/O and I/O* is precharged to the potential of $(V_{CC}-V_{TN})$. Subsequently, the signal CAS* is made inactive so that the column write select signal YWS is also made inactive. Then, the RAS* goes back to the High level. Next, for next access cycle, the pair of digit lines DL and DL* are precharged to the potential of $(\frac{1}{2})V_{CC}$ and the pair of data lines I/O and I/O* are set to the ground potential.

Figure 10:
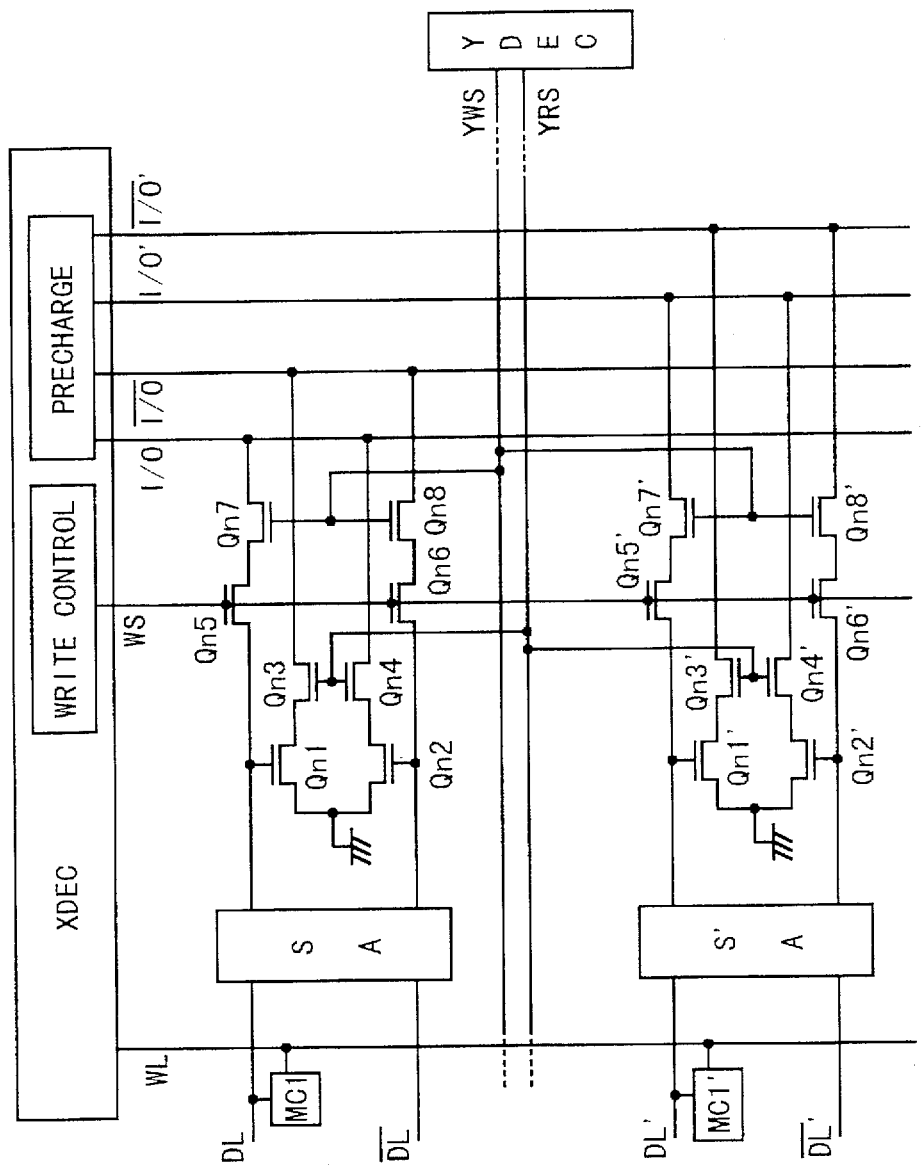
FIG. 10 is a circuit diagram illustrating the structure of a part of a semiconductor memory device according to a second embodiment of the present invention.

Next, the semiconductor memory device according to the second embodiment of the present invention will be described below with reference to FIG. 10. In FIG. 10, two adjacent circuit portions, each of which is similar to that shown in FIG. 7, are provided. However, the pair of data lines I/O and I/O* are provided for the pair of digit lines DL and DL* and the pair of data lines I/O' and I/O'* are provided for the pair of digit lines DL' and DL'*. In this manner, the number of data lines is 4, i.e., two pairs, unlike the second conventional semiconductor memory device in which the number of data lines is 8. Also, the column read select signal YRS and the column write select signal YWS are supplied in common to the two circuit portions. The read and write operations of the semiconductor memory device according to the second embodiment of the present invention are the same as those of the semiconductor memory device according to the first embodiment in each circuit portion. Therefore, the description will be omitted.

Figure 11:
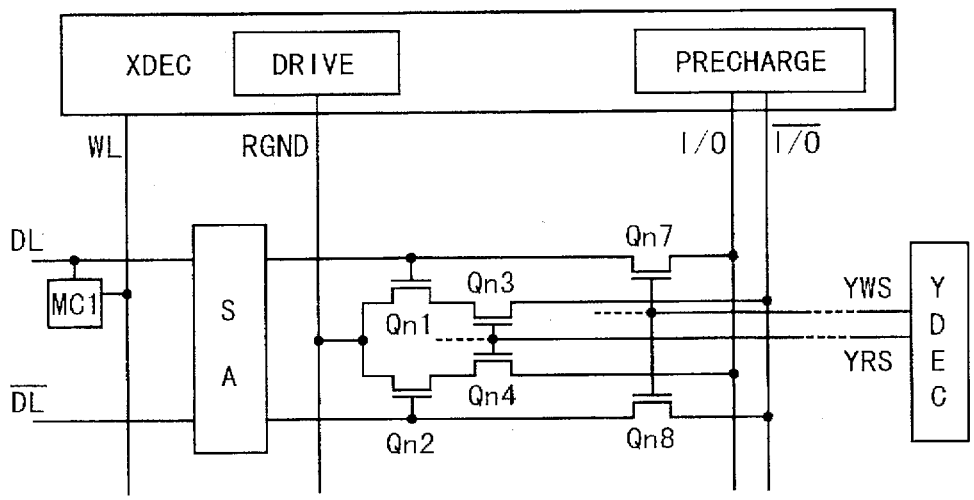
FIG. 11 is a circuit diagram illustrating the structure of a part of a semiconductor memory device according to a third embodiment of the present invention.

Next, the semiconductor memory device according to the third embodiment of the present invention will be described below. FIG. 11 is a diagram illustrating the structure of the third embodiment of the semiconductor memory device. Referring to FIG. 11, the semiconductor memory device of the third embodiment is composed of a pair of digit lines DL and DL*, a word line WL, a memory cell MC1 connected between one of the digit lines DL and DL* and the word line WL, a sense amplifier SA connected to the digit lines DL and DL*, a pair of common data lines I/O and I/O*, and a data transfer circuit including N-channel MOS transistors Qn1 and Qn2, a pair of N-channel MOS transistors Qn3 and Qn4 respectively connected between the transistors Qn1 and the data line I/O* and between the transistor Qn2 and the data line I/O, and a pair of N-channel MOS transistors Qn7 and Qn8, respectively provided between the digit line DL and the data line I/O and between the digit line DL* and the data line I/O*. Thus, one sense amplifier SA is provided for one data transfer circuit. One of the source and drain as signal terminals of each MOS transistor Qn1 or Qn2 is connected to a data output control line RGND. The data output control lines RGND is precharged to a potential approximately equal to the potential of $(\frac{1}{2})(V_{CC}-V_{TN})$ and set to a floating state in a normal state. When one memory cell block to which the data output control line belongs is selected, the data output control line RGND is connected to the ground potential for the read operation. The gates of the MOS transistors Qn1 and Qn2 as control terminals are connected to the digit lines DL and DL*, respectively. The semiconductor memory device further includes a row decoder XDEC and column decoder YDEC. The row decoder XDEC selects and activates only one memory cell block and activates one of a plurality of word lines of the activated memory cell block in accordance with an external address. Also, the row decoder XDEC includes a precharge circuit for precharging the pair of data lines I/O and I/O* to a precharge potential of the pair of digit lines, e.g., a potential of $(\frac{1}{2})V_{CC}$ in this embodiment. The row decoder XDEC further includes a drive circuit for driving the data output control line RGND as described above. The column decoder YDEC generates one of a column read select signal YRS and a column write select signal YWS in accordance with the external address and the write enable signal WE* as described in the first embodiment. The read select signal YRS is supplied to the gates of the MOS transistors Qn3 and Qn4 and the write select signal YWS is supplied to the gates of the MOS transistors Qn7 and Qn8.

Next, the operation of the semiconductor memory device according to the third embodiment of the present invention will be described below. FIG. 12 is a diagram illustrating the wave forms of various signals in the read operation of the semiconductor memory device of the third embodiment. Referring to FIG. 12, the pair of data lines I/O and I/O* are precharged to $(\frac{1}{2})V_{CC}$. In the data read operation, an external input signal RAS (not shown in FIG. 11) is changed from a High level to a Low level, so that the external address received and decoded by the row decoder XDEC. As a result, one of the plurality of word lines WL is selected in accordance with the decoding result of the row decoder, so that the selected word line WL is driven to the High level potential in the selected memory cell block. Also, the data output control line RGND which has been precharged to the potential of about $(½)(V_{CC}-V_{TN})$, is pulled down and connected to the ground potential in the read operation in the selected or activated memory cell block. Thus, even if the column read select signal YRS is supplied to the non-selected memory cell block, no current flows through the transfer circuit because the data output control line RGND is in the floating state.

Next, data stored in the memory cell MC1 connected to the selected word line WL is output onto the pair of digit lines DL and DL*, which have been precharged to the potential of $(½)V_{CC}$. Then, the data on the pair of digit lines DL and DL* is amplified by the sense amplifier SA. The differential signals of data amplified by the sense amplifier SA are applied to the gates of the N-channel MOS transistors Qn1 and Qn2 of the data transfer circuit. In FIG. 12, the High level signal is applied to the gate of the transistor Qn1 and the Low level signal is applied to the gate of the transistor Qn2. Then, the column read select signal YRS, which is generated by the column decoder YDEC based on the external address and the write enable signal WE*, is changed from the Low level to the High level (the column write select signal YWS is remained in the Low level). As a result, the N-channel MOS transistors Qn3 and Qn4 are turned on such that the pair of digit lines DL and DL* are connected to the pair of common data lines I/O and I/O*, and the data read out from the memory cell MC1 is transferred to the pair of common data lines I/O and I/O* as in the first embodiment.

Then, the column write select signal YRS goes to the Low level, the pair of data lines I/O and I/O* are precharged to $(½)V_{CC}$. When the signal RAS* goes back to the High level, the word line WL is dropped to the ground potential. Then, for the next access cycle, the pair of digit lines are precharged to $(½)V_{CC}$ and the control line RGND is set to the floating state of a potential approximately equal to the voltage of $(½)(V_{CC}-V_{TN})$.

In the data write operation, the pair of data lines I/O and I/O* are is precharged to $(½)V_{CC}$. The row address strobe signal RAS* is changed from the High level to the Low level and then one word line WL is selected. Subsequently, when a write enable signal WE* is changed to the Low level. Differential write data signals as a write data are written onto the pair of data lines I/O and I/O*, which have been set to $(½)V_{CC}$. At this time, one of the data lines is in the $V_{CC}$ power supply level and the other is in the GND level. Then, the column write select signal YWS is activated so that the pair of MOS transistors Qn7 and Qn8 are turned on. As a result, the pair of data lines I/O and I/O* are connected to the pair of digit lines DL and DL*. The sense amplifier in the active state SA amplifies the differential write data signals, which are, in turn, written in the memory cell MC1 through the pair of digit lines D1 and DL*. In this case, even if the column write select signal YWS is supplied to the non-selected memory cell blocks, no current flows from the pair of data lines I/O and I/O* because the pair of data lines I/O and I/O* are precharged to the potential equal to the pair of digit lines DL and DL*.

Figure 13:
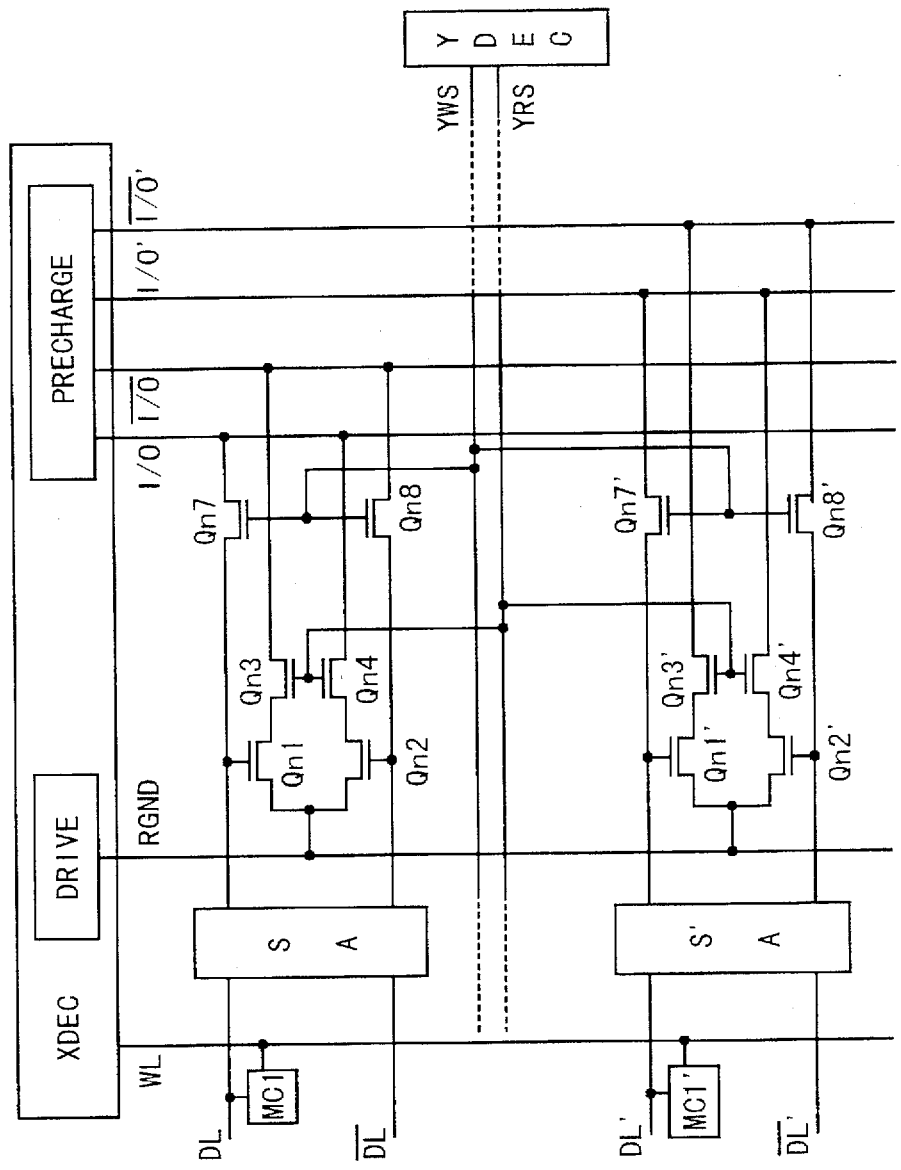
FIG. 13 is a circuit diagram illustrating the structure of a part of a semiconductor memory device according to a fourth embodiment of the present invention.

Next, the semiconductor memory device according to the fourth embodiment of the present invention will be described below with reference to FIG. 13. In FIG. 13, two adjacent circuit portions, each of which is similar to that shown in FIG. 11 are provided. However, the pair of data lines I/O and I/O* are provided for the pair of digit lines DL and DL* and the pair of data lines I/O' and I/O'* are provided for the pair of digit lines DL' and DL'*. In this manner, the number of data lines is 4, i.e., two pairs, unlike the second conventional semiconductor memory device in which the number of data lines is 8. Also, the column read select signal YRS and the column write select signal YWS are supplied in common with the two circuit portions. The read and write operations of the semiconductor memory device according to the second embodiment of the present invention are the same as those of the semiconductor memory device according to the first embodiment in each circuit portion. Therefore, the description will be omitted.

As described above, according to the present invention, the column read select signal and column write select signal are generated from the column decoder, and in a read operation, the data transfer is performed from the sense amplifier to the pair of data lines via two series connected MOS transistors. Therefore, the data lines can be used in common for both the read operation and write operation, resulting in prevention of increase in a chip area due to the data line wirings. Also, access speed can be increased.

What is claimed is:

1. A semiconductor memory device comprising:

a memory cell block composed of a plurality of memory cells arranged in a matrix;

a pair of data lines provided for said memory cell block;

a plurality of word lines each of which is connected to a row of memory cells of said memory cell block;

a row decoder circuit provided for said memory cell block, and selectively activated in accordance with an address to activate one of said plurality of word lines and said pair of data lines;

a pair of digit lines provided for each column of memory cells of said memory cell block;

a sense amplifier provided for each column of memory cells, for amplifying differential data signals on said digit lines;

a column decoder circuit provided for said memory cell block, for selectively activating one of a plurality of columns of memory cells in accordance with said address and selectively setting the activated column of memory cells to one of a read mode and a write mode in a read/write control signal;

a read data transfer circuit provided for each column of memory cells, for respectively transferring differential read data signals to said digit lines in said read mode when the column of memory cells is activated, said differential read data signals corresponding to data read out from one memory cell of said activated column of memory cells connected to the activated word line and amplified by said sense amplifier; and a write data transfer circuit provided for each column of memory cells, for respectively transferring differential write data signals on said data lines to said digit lines in said write mode when the column of memory cells is activated, data corresponding to said differential write data signals being written in one memory cell of said activated column of memory cells connected to the activated word line.

2. A semiconductor memory device according to claim 1, wherein said column decoder circuit generates one of a read select signal and a write select signal in accordance with said address and said read/write control signal such that said read select signal is supplied to said read data transfer circuit for said activated column of memory cells and said write select signal is supplied to said write data transfer circuit for said activated column of memory cells.

3. A semiconductor memory device according to claim 2, wherein said read data transfer circuit includes:

a pair of first MOS transistors respectively connected to said data lines and turned on in response to said read select signal; and a pair of second MOS transistors respectively connected to said first MOS transistors in series, gates of said second MOS transistors being respectively connected to said digit lines, wherein said second MOS transistors are operable to drive said data lines via said first MOS transistors in response to said differential read data signals in said read mode.

4. A semiconductor memory device according to claim 3, wherein one electrode of each of said second MOS transistors is fixedly connected to ground potential.

5. A semiconductor memory device according to claim 3, wherein said row decoder circuit includes a potential control circuit for controlling a potential of a read drive line connected to one electrode of each of said second MOS transistors for each column of memory cells.

6. A semiconductor memory device according to claim 5, wherein said potential control circuit dynamically drives said read drive line such that the potential of said read drive line is set to a ground potential in said read mode when said memory cell block is activated and is set to a predetermined potential otherwise.

7. A semiconductor memory device according to claim 2, wherein said write data transfer circuit includes a pair of third MOS transistors respectively provided between said data lines and said digit lines and operable to be turned on in response to said write select signal.

8. A semiconductor memory device according to claim 7, wherein said row decoder circuit includes a data line precharging circuit for precharging said data lines to a potential equal to a precharge potential of said digit lines.

9. A semiconductor memory device according to claim 7, wherein said write data transfer circuit further includes a pair of fourth MOS transistors respectively provided between said data lines and said digit lines and turned on in response to a write control signal, and wherein said row decoder circuit includes a data line precharging circuit for precharging said data lines to a potential corresponding to a higher side of said differential read data signals in said read mode when said memory cell block is activated.

10. A semiconductor memory device according to claim 9, wherein said data line precharging circuit sets potential of said data lines to a ground potential in a mode other than said read mode or when said memory cell block is not activated.

11. A semiconductor memory device comprising:

a memory cell block composed of a plurality of memory cells arranged in a matrix;

two pairs of data lines provided for said memory cell block and respectively corresponding to every two columns of memory cells;

a plurality of word lines each of which is connected to a row of memory cells of said memory cell block;

a row decoder circuit provided for said memory cell block, and selectively activated in accordance with an address to activate one of said plurality of word lines and said two pair of data lines;

a pair of digit lines provided for each column of memory cells of said memory cell block;

a sense amplifier provided for each column of memory cells, for amplifying differential data signals on said digit lines;

a column decoder circuit provided for said memory cell block, for selectively activating two of a plurality of columns of memory cells in accordance with said address and selectively setting the two activated columns of memory cells to one of a read mode and a write mode in a read/write control signal;

a read data transfer circuit provided for each column of memory cells, for respectively transferring differential read data signals on said digit lines to a corresponding one of said two pairs of digit lines in said read mode when said column of memory cells is activated by said column decoder circuit, said differential read data signals corresponding to data read out from one memory cell of said activated column of memory cells connected to the activated word line and amplified by said sense amplifiers; and a write data transfer circuit provided for each column of memory cells, for respectively transferring differential write data signals on said data lines to the corresponding one of said two pairs of digit lines in said write mode when said column of memory cells is activated by said column decoder circuit, data corresponding to said differential write data signals being written in one memory cell of said activated columns of memory cells connected to the activated word line.

12. A semiconductor memory device according to claim 11, wherein said column decoder circuit generates one of a read select signal and a write select signal in accordance with said address and said read/write control signal such that said read select signal is supplied to said read data transfer circuits for said two activated columns of memory cells and said write select signal is supplied to said write data transfer circuits for said two activated columns of memory cells.

13. A semiconductor memory device according to claim 12, wherein said read data transfer circuit includes:

a pair of first MOS transistors respectively connected to said data lines of the corresponding pair and turned on in response to said read select signal; and a pair of second MOS transistors respectively connected to said first MOS transistors in series, gates of said second MOS transistors being respectively connected to said digit lines, wherein said second MOS transistors are operable to drive said data lines of the corresponding pair via said first MOS transistors in response to said differential read data signals in said read mode.

14. A semiconductor memory device according to claim 13, wherein one electrode of each of said second MOS transistors is fixedly connected to ground potential.

15. A semiconductor memory device according to claim 13, wherein said row decoder circuit includes a potential control circuit for controlling a potential of a read drive line connected to one electrode of each of said second MOS transistors for each column of memory cells.

16. A semiconductor memory device according to claim 15, wherein said potential control circuit dynamically drives said read drive line such that the potential of said read drive line is set to a ground potential in said read mode when said memory cell block is activated and is set to a predetermined potential otherwise.

17. A semiconductor memory device according to claim 12, wherein said write data transfer circuit includes a pair of third MOS transistors respectively provided between said data lines of the corresponding pair and said digit lines and operable to be turned on in response to said write select signal.

18. A semiconductor memory device according to claim 17, wherein said row decoder circuit includes a data line precharging circuit for precharging said two pair of data lines to a potential equal to a precharge potential of said digit lines corresponding pairs.

19. A semiconductor memory device according to claim 17, wherein said write data transfer circuit further includes a pair of fourth MOS transistors respectively provided between said data lines of the corresponding pair and said digit lines and turned on in response to a write control signal, and wherein said row decoder circuit includes a data line precharging circuit for precharging said two pairs of data lines to a potential corresponding to a higher side of said differential read data signals in said read mode when said memory cell block is activated.

20. A semiconductor memory device according to claim 19, wherein said data line precharging circuit sets a potential of said two pairs of data lines to a ground potential in a mode other than said read mode or when said memory cell block is not activated.

21. A semiconductor memory device comprising:

a pair of data lines on which information for a memory cell is transferred;

a sense amplifier for amplifying said information;

a pair of first transistors receiving said information amplified by said sense amplifier at control terminals;

a pair of second transistors provided between signal terminals of said pair of first transistors and said pair of data lines, for outputting said amplified information to said pair of data lines in response to a data read column select signal supplied to control terminals of said pair of second transistors; and a pair of third transistors provided between said pair of data lines and said sense amplifier, for supplying said information on said pair of data lines to said sense amplifier in response to a data write column select signal supplied to control terminals of said pair of third transistors.

* * * * *